United States Patent
Huemoeller

(10) Patent No.: US 11,881,471 B2
(45) Date of Patent: Jan. 23, 2024

(54) SEMICONDUCTOR DEVICE AND MANUFACTURING METHOD THEREOF

(71) Applicant: Amkor Technology Singapore Holding Pte. Ltd., Singapore (SG)

(72) Inventor: Ronald Huemoeller, Gilbert, AZ (US)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 17/666,732

(22) Filed: Feb. 8, 2022

(65) Prior Publication Data

US 2022/0238483 A1    Jul. 28, 2022

Related U.S. Application Data

(63) Continuation of application No. 16/707,926, filed on Dec. 9, 2019, now Pat. No. 11,244,923, which is a continuation of application No. 15/837,917, filed on Dec. 11, 2017, now Pat. No. 10,504,871.

(51) Int. Cl.
*H01L 23/00* (2006.01)
*H01L 21/48* (2006.01)
*H01L 21/56* (2006.01)
*H01L 21/683* (2006.01)
(Continued)

(52) U.S. Cl.
CPC .......... *H01L 24/97* (2013.01); *H01L 21/4853* (2013.01); *H01L 21/568* (2013.01); *H01L 21/6835* (2013.01); *H01L 23/49816* (2013.01); *H01L 23/49822* (2013.01); *H01L 21/561* (2013.01); *H01L 21/563* (2013.01); *H01L 23/3128* (2013.01); *H01L 2221/68345* (2013.01); *H01L 2221/68381* (2013.01); *H01L 2221/68386* (2013.01); *H01L 2224/95001* (2013.01)

(58) Field of Classification Search
CPC ... H01L 24/97; H01L 21/4853; H01L 21/568; H01L 21/6835; H01L 21/561; H01L 21/563; H01L 23/49816; H01L 23/49822; H01L 23/3128; H01L 2221/68345; H01L 2221/68381; H01L 2221/68386; H01L 2224/95001
See application file for complete search history.

(56) References Cited

U.S. PATENT DOCUMENTS

| | | |
|---|---|---|
| 6,130,473 A | 10/2000 | Mostafazadeh et al. |
| 8,362,612 B1 | 1/2013 | Paek et al. |
| 9,378,983 B2 | 6/2016 | Choi et al. |

(Continued)

*Primary Examiner* — Shahed Ahmed
*Assistant Examiner* — Vicki B. Booker
(74) *Attorney, Agent, or Firm* — McAndrews, Held & Malloy, Ltd.

(57) ABSTRACT

A semiconductor device and a method of manufacturing a semiconductor device. For example, various aspects of this disclosure provide a semiconductor device having an ultra-thin substrate, and a method of manufacturing a semiconductor device having an ultra-thin substrate. As a non-limiting example, a substrate structure comprising a carrier, an adhesive layer formed on the carrier, and an ultra-thin substrate formed on the adhesive layer may be received and/or formed, components may then be mounted to the ultra-thin substrate and encapsulated, and the carrier and adhesive layer may then be removed.

20 Claims, 13 Drawing Sheets

(51) Int. Cl.
*H01L 23/498* (2006.01)
*H01L 23/31* (2006.01)

(56) References Cited

U.S. PATENT DOCUMENTS

| | | |
|---|---|---|
| 9,543,242 B1 | 1/2017 | Kelly et al. |
| 2006/0013680 A1 | 1/2006 | Haba et al. |
| 2008/0157358 A1 | 7/2008 | Yang |
| 2009/0224391 A1* | 9/2009 | Lin .................. H01L 24/18 |
| | | 438/106 |
| 2010/0301474 A1 | 12/2010 | Yang |
| 2011/0053318 A1 | 3/2011 | Hu |
| 2012/0153494 A1* | 6/2012 | Manepalli ............ H01L 25/50 |
| | | 257/774 |
| 2012/0187568 A1 | 7/2012 | Lin et al. |
| 2014/0077361 A1 | 3/2014 | Lin et al. |
| 2015/0243575 A1 | 8/2015 | Strothmann et al. |
| 2015/0255431 A1 | 9/2015 | Su et al. |
| 2015/0318262 A1 | 11/2015 | Gu et al. |
| 2017/0117200 A1 | 4/2017 | Kim et al. |
| 2017/0141046 A1 | 5/2017 | Jeong et al. |
| 2017/0250158 A1 | 8/2017 | Chinnusamy et al. |
| 2018/0012776 A1 | 1/2018 | Ross et al. |
| 2018/0114749 A1 | 4/2018 | Dimaano, Jr. et al. |
| 2019/0006195 A1 | 1/2019 | Qu et al. |
| 2019/0103365 A1 | 4/2019 | Singh et al. |
| 2020/0075540 A1 | 3/2020 | Lu et al. |
| 2020/0083189 A1 | 3/2020 | Chen et al. |
| 2021/0066093 A1 | 3/2021 | Kim et al. |
| 2021/0265182 A1 | 8/2021 | Baloglu et al. |
| 2021/0265192 A1 | 8/2021 | Baloglu et al. |

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. patent application Ser. No. 16/707,926 filed Dec. 9, 2019, now U.S. Pat. No. 11,244,923, which is a continuation of U.S. patent application Ser. No. 15/837,917, filed Dec. 11, 2017, now U.S. Pat. No. 10,504,871, the disclosures of which are hereby incorporated herein by reference in their entirety. U.S. patent application Ser. No. 14/823,689, filed Aug. 11, 2015, and titled "SEMICONDUCTOR PACKAGE AND FABRICATING METHOD THEREOF"; and U.S. Pat. No. 8,362,612, titled "SEMICONDUCTOR DEVICE AND MANUFACTURING METHOD THEREOF" are also hereby incorporated herein by reference in their entirety.

BACKGROUND

Present semiconductor packages and methods for forming semiconductor devices are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
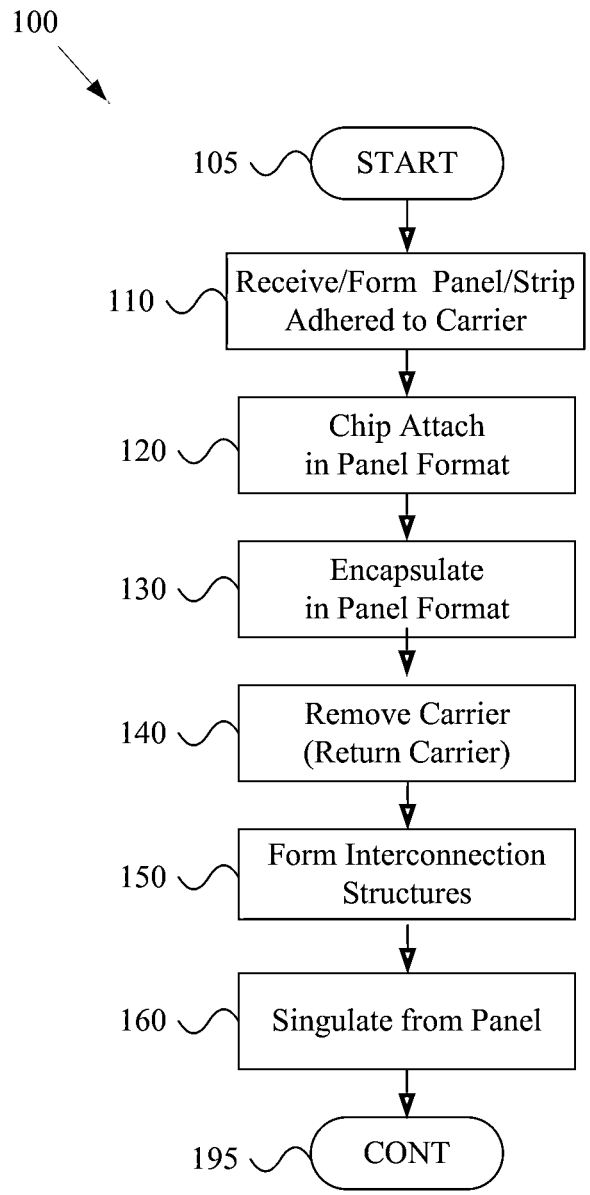
FIG. 1 shows a flow diagram of an example method of making an electronic device, in accordance with various aspects of the present disclosure.

Various aspects of this disclosure provide a semiconductor device and a method of manufacturing a semiconductor device. For example, various aspects of this disclosure provide a semiconductor device having an ultra-thin substrate, and a method of manufacturing a semiconductor device having an ultra-thin substrate. As a non-limiting example, a substrate structure comprising a carrier, an adhesive layer formed on the carrier, and an ultra-thin substrate formed on the adhesive layer may be received and/or formed, components may then be mounted to the ultra-thin substrate and encapsulated, and the carrier and adhesive layer may then be removed.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide a semiconductor device or package and a fabricating (or manufacturing) method thereof, which can decrease the cost, increase the reliability, reduce the size, and/or increase the manufacturability of the semiconductor device or package.

The above and other aspects of the present disclosure will be described in or be apparent from the following description of various example implementations. Various aspects of the present disclosure will now be presented with reference to accompanying drawings, such that those skilled in the art may readily practice the various aspects.

FIG. 1 shows a flow diagram of an example method of making an electronic device (e.g., a semiconductor device or package, etc.), in accordance with various aspects of the present disclosure. The example method 100 may, for example, share any or all characteristics with any other example method(s) discussed herein (e.g., the example method 800 of FIG. 8, etc.). FIGS. 2A-2C, 3A-3C, 4A-4C, 5A-5C, 6A-6C, and 7A-7C show perspective and/or cross-sectional views illustrating an example electronic device (e.g., a semiconductor device or package, etc.) and an example method of making an example electronic device, in accordance with various aspects of the present disclosure. FIGS. 2A-2C, 3A-3C, 4A-4C, 5A-5C, 6A-6C, and 7A-7C may, for example, illustrate an example electronic device at various blocks (or steps or stages) of the method 100 of FIG. 1. FIG. 1 and FIGS. 2A-2C, 3A-3C, 4A-4C, 5A-5C, 6A-6C, and 7A-7C will now be discussed together. It should be noted that the order of the example blocks of the method 100 may vary without departing from the scope of this disclosure.

The example method 100 may begin executing at block 105. The method 100 may begin executing in response to any of a variety of causes or conditions, non-limiting examples of which are provided herein. For example, the method 100 may begin executing automatically in response to one or more signals received from one or more upstream and/or downstream manufacturing stations, in response to a signal from a central manufacturing line controller, upon arrival of components and/or manufacturing materials utilized during performance of the method 100, etc. Also for example, the method 100 may begin executing in response to an operator command to begin. Additionally for example, the method 100 may begin executing in response to receiving execution flow from any other method block (or step) discussed herein.

The example method 100 may, at block 110, comprise receiving (and/or forming) a panel (or strip) of substrates coupled to a carrier. Block 110 may comprise receiving (and/or forming) the panel (or strip) of substrates in any of a variety of manners, non-limiting examples of which are provided herein. For example, various example aspects of block 110 are presented in FIGS. 2A-2C. Block 110 and FIGS. 2A-2C will now be discussed together.

Figure 2A:
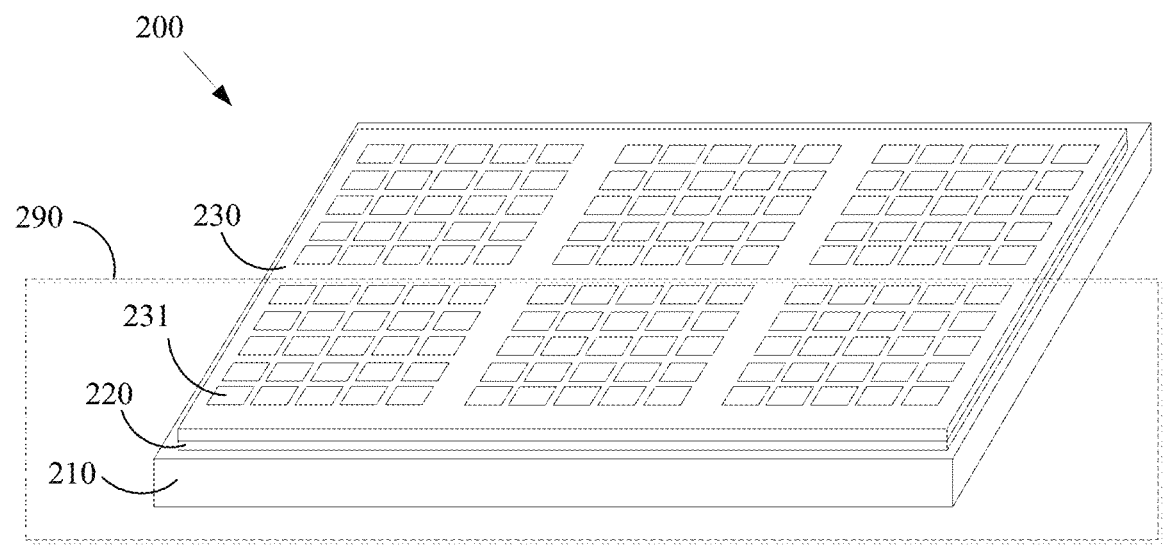
FIGS. 2A-2C show views illustrating example electronic device structures and example methods of making electronic device structures, in accordance with various aspects of the present disclosure, for example as shown in the flow diagram of FIG. 1.
Figure 2B:
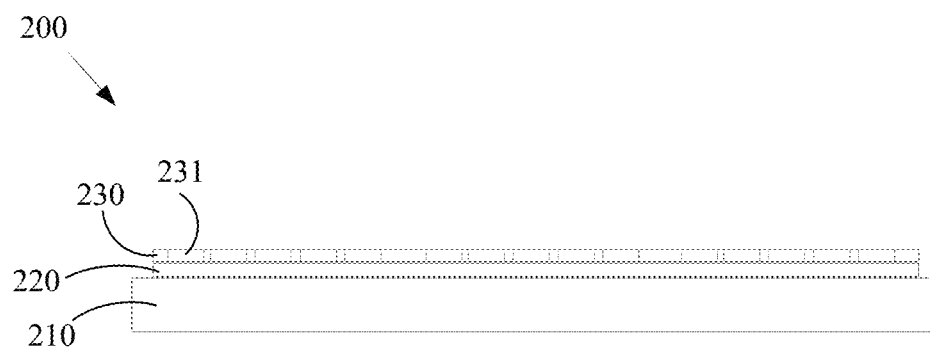
Figure 2C:
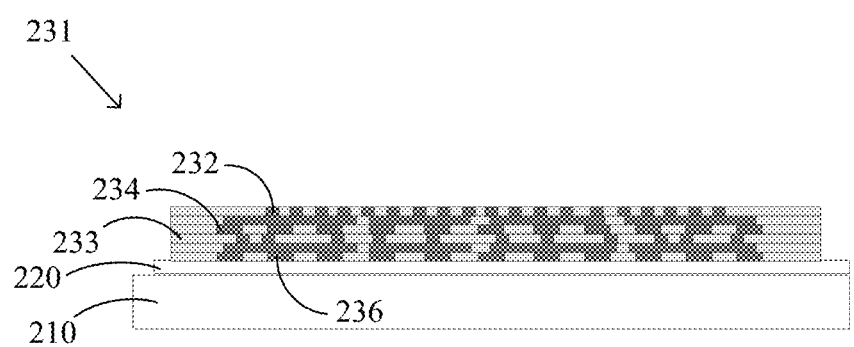

FIGS. 2A-2C show an example electronic device structure 200 received (or formed) panel of substrates coupled to a carrier. More specifically, the example electronic device structure 200 comprises a panel of substrates 230 coupled to a carrier 210 with an adhesive layer 220.

The example panel of substrates 230 comprises a two-dimensional array of substrates 231, which may also be referred to herein as signal distribution structures (SDSs). The panel 230 may, for example, be square and/or rectangular. In an example implementation, the panel 230 may be 600 mm×600 mm in size (or 800 mm×800 mm, or 1000 mm×1000 mm, etc.). A strip (e.g., a portion of the panel 230) may, for example, be 200 mm×100 mm in size (or 600 mm×200 mm, or 400 mm×100 mm, etc.). An example strip 290 of the panel 230 is shown at FIG. 2A. Such example strip 290 is, however, merely an example and non-limiting.

Each SDS 231 (or substrate) may, for example, correspond to a semiconductor device package being produced. The example SDS 231 (e.g., as shown in FIG. 2C) comprises a plurality of dielectric layers 233 and a plurality of conductive layers 234.

The dielectric layers 233 may comprise one or more layers of any of a variety of dielectric materials. For example, the dielectric layers 233 may comprise a dielectric material comprising glass, epoxy and glass, a glass-reinforced epoxy laminate, a glass fiber epoxy, etc. For example, the dielectric layers 233 may be formed from dielectric material not generally utilized in wafer production and/or may be formed by dielectric layer forming techniques not generally utilized in wafer production. For example, the dielectric layers 233 may comprise film-based epoxies (e.g., buildup films utilized in substrates, films comprising a combination of organic epoxy resins, hardener, and inorganic filler micro-particles, etc.).

In other example implementations, the dielectric layers 233 may comprise inorganic dielectric materials (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

The dielectric layers 233 may be formed (e.g., formed on the adhesive layer 230 and/or other dielectric layers and/or conductive layers) using any one or more of a variety of processes. For example, the dielectric layers 233 may be pressed on and/or rolled on (e.g., as a pressed and/or rolled on film, etc.). Also for example, the dielectric layers 233 may be formed by spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc. The scope of the present disclosure, however, is not limited to any particular manner of forming a dielectric layer.

Each of the dielectric layers 233 may, for example, be formed to be very thin. For example, each of the dielectric layers 233 may have a thickness less than or equal to 15 um (e.g., in the range of 5-15 um, etc.). The respective thicknesses of the dielectric layers 233 (e.g., all of the dielectric layers 233, a subset thereof, etc.) may, for example, be consistent.

The conductive layers 234 may comprise one or more layers of any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

The conductive layers 234 may be formed (e.g., formed on the adhesive layer 230 and/or on other conductive layers 234 and/or on dielectric layers 233) utilizing any one or more of a variety of processes (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

As discussed herein, each SDS 231 may be formed of one or more thin dielectric layers and one or more thin conductive layers. Each SDS 231 may thus be coreless (or without a discernable core layer). For example, the SDS 231 may be formed without the utilization of a fully cured core layer during the build-up process. Also for example, the SDS 231 may be formed without a core layer comprising glass. Further for example, in an example implementation, the SDS 231 may only comprise dielectric film layers (e.g., of equal thickness and/or material, etc.). Further for example, the SDS 231 may be formed without having a layer of which the primary purpose is structural support.

Each SDS 231 (or substrate) may, for example, be formed to have a thickness of 100 um or less (e.g., in the 30 um to 100 um range, etc.).

Note that in an example implementation a first conductive layer (e.g., a copper layer, seed layer, interface layer, etc.) may be formed on the adhesive layer 230. Such a first conductive layer may, for example, comprise a blanket layer that may be later removed (e.g., by etching, by chemical/mechanical planarization, etc.), for example at block 140 or block 150. The dielectric layers 233 and conductive layers 234 may then, for example, be formed on such a first conductive layer. For example, the first conductive layer may provide separation between the dielectric layers 233 and the adhesive layer 220.

One of the advantages of various aspects of this disclosure is that it can provide for very thin dielectric layers and fine RDLs (or conductive layers). For example, such dielectric layers may comprise thin polymers (e.g., polyimide, polyimide derivatives, etc.), film-based epoxies (e.g., buildup films utilized in substrates, films comprising a combination of organic epoxy resins, hardener, and inorganic filler microparticles, etc.). Signal routing lines (e.g., traces, etc.) may, for example, be provided with less than 10 um in total copper thickness (e.g., using electroless copper or sputtered copper complexes as the seed). Conductive signal lines may, for example, be routed with thickness of 10 um or less in width and height if desired, to produce signal pitches down to ~4 um (e.g., 4 micrometers +/−10%, or less).

The example SDS 231 also comprises conductive interconnection structures 232, for example top-side conductive interconnection structures (e.g., pads, lands, traces, under-bump metallization layers, bumps, posts, pillars, etc.), for example to which one or more semiconductor dies and/or other electronic components (e.g., passive components, etc.) may be attached. The conductive interconnection structures 232 may, for example, comprise any or all of the example characteristics of the conductive layers 234. The conductive interconnection structures 232 may, for example, be formed (e.g., on the adhesive layer 230, on other conductive layers, on the dielectric layers, etc.) utilizing any of a variety of techniques, for example any or all of the techniques discussed herein with regard to the conductive layers 234.

Additional example signal distribution structures (e.g., dielectric layers, conductive layers, interconnection structures, etc.) and/or methods of forming such structures are provided in U.S. patent application Ser. No. 14/823,689, filed Aug. 11, 2015, and titled "SEMICONDUCTOR PACKAGE AND FABRICATING METHOD THEREOF"; and U.S. Pat. No. 8,362,612, titled "SEMICONDUCTOR DEVICE AND MANUFACTURING METHOD THEREOF"; the contents of each of which are hereby incorporated herein by reference in their entirety.

The example SDS 231 additionally comprises conductive interconnection structures 236, for example bottom-side conductive interconnection structures 236, (e.g., pads, lands, traces, under-bump metallization layers, bumps, posts, pillars, etc.), for example to which one or more package interconnection structures (e.g., conductive balls or bumps, solder balls or bumps, posts or pillars, etc.) may be attached (e.g., at block 150, etc.).

In an example implementation in which the conductive interconnection structures (232 and/or 236) comprise one or more under-bump metallization (UBM) layers, such UBM layers and/or the forming thereof may comprise any of a variety of characteristics. For example, the UBM structure (or layers) may for example comprise a layer of titanium-tungsten (TiW), which may be referred to as a layer or seed layer. Such layer may, for example, be formed by sputtering. Also for example, the UBM structure (or layers) may comprise a layer of copper (Cu) on the layer of TiW. Such layer may also, for example, be formed by sputtering. In another example implementation, forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure (or layers) and/or processes utilized to form the UBM structure are not limited to the examples given. For example, the UBM structure may comprise a multilayered structure of chrome/chrome-copper alloy/copper (Cr/Cr-Cu/Cu), titanium-tungsten alloy/copper (Ti—W/Cu), aluminum/nickel/copper (Al/Ni/Cu), equivalents thereof, etc. The UBM structure may also, for example, comprise aluminum, palladium, gold, silver, alloys thereof, etc.

In an example implementation, the conductive interconnection structures (232 and/or 236) may comprise conductive balls or bumps (e.g., solder balls or bumps, C4 bumps, wafer-type bumps, etc.). For example, in an example implementation including a solder ball or bump, such balls or bumps may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosure is not limited thereto.

Such conductive balls or bumps may be formed in any of a variety of manners. For example, such conductive balls or bumps may be formed by ball-dropping, bumping, metal-plating, pasting and reflowing, printing, etc. For example, such conductive balls or bumps may be formed by dropping conductive balls on UBM structures (or conductive pads), reflowing, and cooling.

In an example implementation in which the conductive interconnection structures (232 and/or 236) comprise conductive posts or pillars, such conductive posts or pillars may comprise any of a variety of characteristics. For example, such conductive pillars may be cylinder-shaped, elliptical cylinder-shaped, rectangular post-shaped, etc. The conductive pillars may, for example, comprise a flat upper end, a concave upper end, a convex upper end, etc. The conductive pillars may, for example, comprise any of the materials discussed herein with regard to the conductive layers. In an example implementation, the conductive pillars may comprise copper (e.g., pure copper, copper with some impurities, etc.), a copper alloy, etc. In an example implementation, solder caps (or domes) may be formed on the conductive pillars. The conductive posts or pillars may be formed in any of a variety of manners (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

The carrier 210 may comprise any of a variety of characteristics. For example, the carrier 210 may comprise a glass carrier (e.g., a solid panel of glass). Also for example, the carrier 210 may comprise a metal carrier, a silicon carrier, a plastic carrier, etc.

The adhesive layer 220 may, for example, adhesively couple the panel 230 (or strip) to the carrier 210. The adhesive layer 220 may comprise any of a variety of characteristics. For example, the adhesive layer 220 may comprise a UV-release adhesive, which may for example be releasable by applying light (e.g., laser, soft beam, etc.) energy to the adhesive layer 220 through the glass carrier 210. The adhesive layer 220 may also, for example, comprise a thermal-release adhesive, a chemical-release adhesive, etc. The adhesive layer 220 may, for example, be formed by applying a preformed adhesive film, by printing, spray-coating, dipping, etc.

Though the adhesive layer 220 is shown covering less than the entire top side of the carrier 210 (e.g., covering only the bottom side of the panel 230 in FIG. 2A), the adhesive layer 220 may also for example cover the entire top side of the carrier 210. Similarly, the panel 230 may also cover the entire top side of the adhesive layer 220 and/or the carrier 210.

Figure 8:
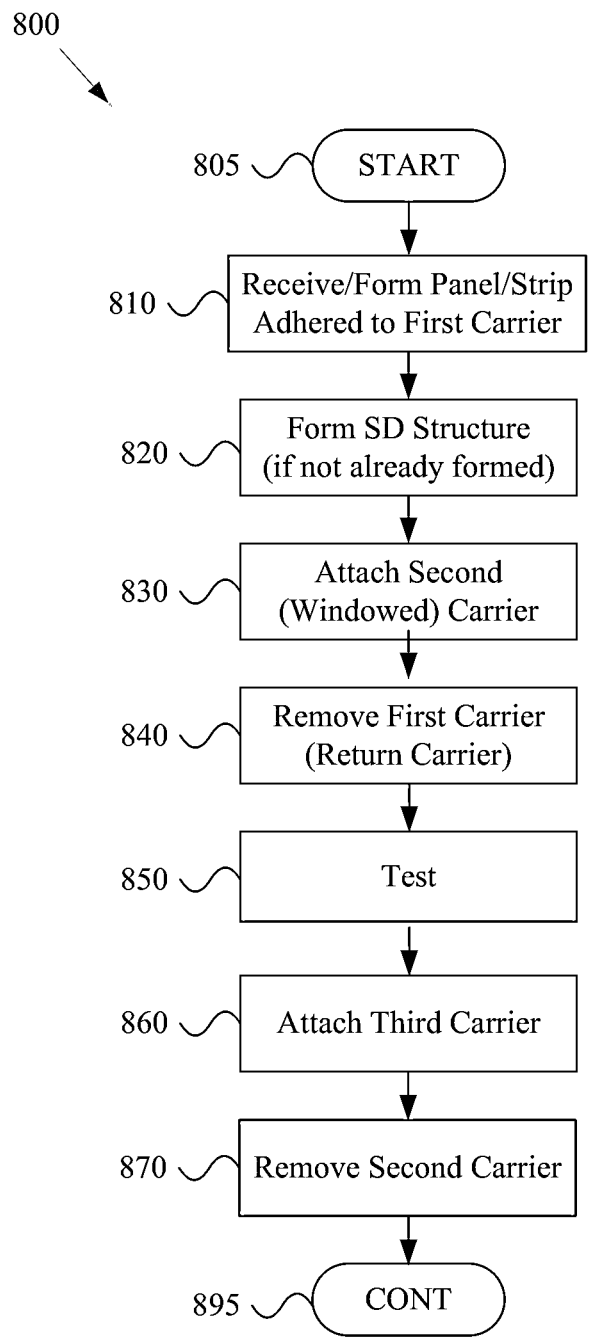
FIG. 8 shows a flow diagram of an example method of making an electronic device, in accordance with various aspects of the present disclosure.

Note that other example methods of forming the panel of substrates adhered to the carrier are provided herein, for example in the discussion of the example method 800 of FIG. 8. For example, block 110 may share any or all characteristics with any or all blocks of the example method 800 of FIG. 8.

Also note that other manners of coupling the panel of substrates to the carrier, different from utilizing the adhesive layer 220, may also be performed (e.g., vacuum coupling, mechanical coupling, magnetic coupling, electrostatic coupling, etc.). Thus, the scope of this disclosure is not limited by characteristics of the adhesive and/or by characteristics of any particular manner of performing adhesive coupling.

As discussed herein, block 110 may comprise forming the panel of substrates adhered to the carrier, or may comprise receiving the panel of substrates adhered to the carrier (e.g., from an upstream geographically co-located process, from an off-campus supplier, etc.), and/or any combination thereof.

In general, block 110 may comprise receiving (and/or forming) a panel (or strip) of substrates coupled to a carrier. Thus, the scope of this disclosure should not be limited by particular characteristics of any particular structure or of any particular manner of forming such structure.

The example method 100 may, at block 120, comprise attaching (or mounting or coupling) one or more semiconductor dies (or chips) and/or other electronic components (e.g., passive electronic components, etc.) to the substrates received at block 110. Block 120 may comprise performing such attaching in any of a variety of manners, non-limiting examples of which are provided herein. For example, various example aspects of block 120 are presented in FIGS. 3A-3C. Block 120 and FIGS. 3A-3C will now be discussed together.

Figure 3A:
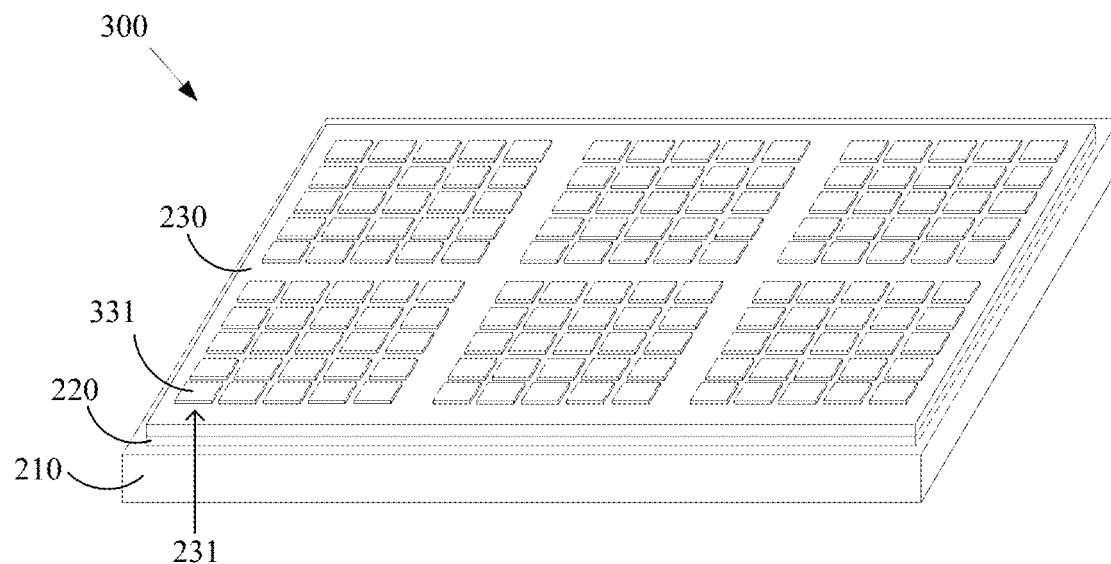
FIGS. 3A-3C show views illustrating example electronic device structures and example methods of making electronic device structures, in accordance with various aspects of the present disclosure, for example as shown in the flow diagram of FIG. 1.
Figure 3B:
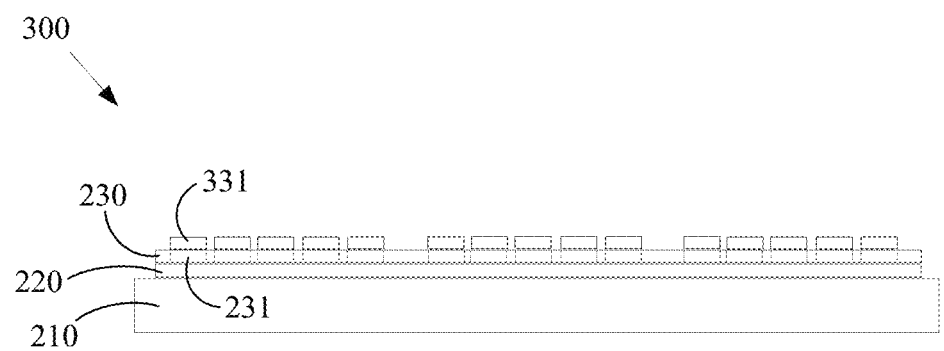
Figure 3C:
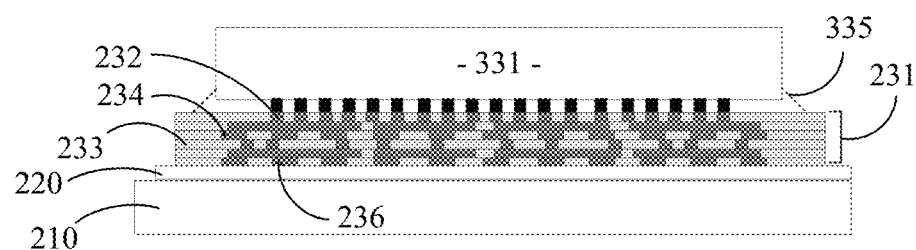

As shown in FIGS. 3A-3C, the semiconductor dies 331 are each attached to a respective substrate 231 (or signal distribution structure (SDS)).

Though the examples presented herein generally concern the attaching of one or more semiconductor dies, any one or more of a variety of electronic components (e.g., instead of or in addition to the semiconductor die) may be attached to a substrate 231. The one or more electronic component(s) may, for example, comprise a semiconductor die 331 or other active component. Such a semiconductor die may, for example, comprise a processor die, microprocessor, microcontroller, co-processor, general purpose processor, application-specific integrated circuit, programmable and/or discrete logic device, memory device, combination thereof, equivalent thereof, etc. The one or more electronic components may also, for example, comprise one or more passive electronic devices (e.g., resistors, capacitors, inductors, etc.).

Block 120 may comprise attaching (or mounting) the semiconductor dies 331 (or other electronic component(s)) to the substrates 231 utilizing any of a variety of types of interconnection structures (e.g., conductive balls or bumps, solder balls or bumps, metal posts or pillars, copper posts or pillars, solder-capped posts or pillars, solder paste, conductive adhesive, etc.). Block 120 may comprise attaching (or mounting) the semiconductor dies 331 to the substrates 231 utilizing any of a variety of bonding techniques (e.g., thermocompression bonding, mass reflow, laser reflow, adhesive attachment, etc.). In an example implementation, block 120 may comprise utilizing conductive bumps to electrically connect die bond pads of the semiconductor die 331 to respective substrate bond pads (or other top-side conductive interconnection structures) of the substrate 231. Such die bond pads may, for example, be exposed through respective openings (or apertures) in a dielectric layer (or passivation layer) on the semiconductor die 331.

Block 120 may also, for example, comprise forming an underfill between the mounted semiconductor die 331 and the substrate 231 (or SDS). The underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. The underfill may be formed in any of a variety of manners (e.g., capillary underfilling, pre-applied underfilling of a liquid or paste or preformed sheet, molded underfilling, etc.). Such underfill may comprise any of a variety of characteristics (e.g., capillary underfill, pre-applied underfill, molded underfill, etc.). Note that in various alternative example implementations, such underfill is not formed at block 120 (e.g., never formed, formed at a later process step, etc.).

An example underfill 335 is shown in FIG. 3C, which fills the space between the semiconductor die 331 and the substrate 231 (or SDS). The example underfill 335 may also, for example, cover at least a portion of lateral side surfaces of the semiconductor die 331. Note that, as will be shown later, the space between the semiconductor die 331 and the substrate 231 may be fill with encapsulating material (e.g., as a molded underfill, etc.).

In general, block 120 may comprise attaching (or mounting or coupling) one or more semiconductor dies and/or other electronic components (e.g., passive electronic components, etc.) to the substrates (or panel thereof) received at block 110. Thus, the scope of this disclosure is not to be limited by characteristics of any particular form of attachment or of any particular manner of performing such attaching.

The example method 100 may, at block 130, comprise encapsulating the panel (or strip) (e.g., as received at block 110) with the attached dies (e.g., as attached at block 120) in an encapsulating material. Block 130 may comprise performing such encapsulating in any of a variety of manners, non-limiting examples of which are provided herein. For example, various example aspects of block 130 are presented in FIGS. 4A-4C. Block 130 and FIGS. 4A-4C will now be discussed together.

The encapsulating material 431 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). Block 130 may, for example, comprising forming the encapsulating material 431 in any of a variety of manners (e.g., compression molding, transfer molding, liquid encapsulant molding, vacuum lamination, paste printing, film assisted molding, etc.).

Figure 4A:
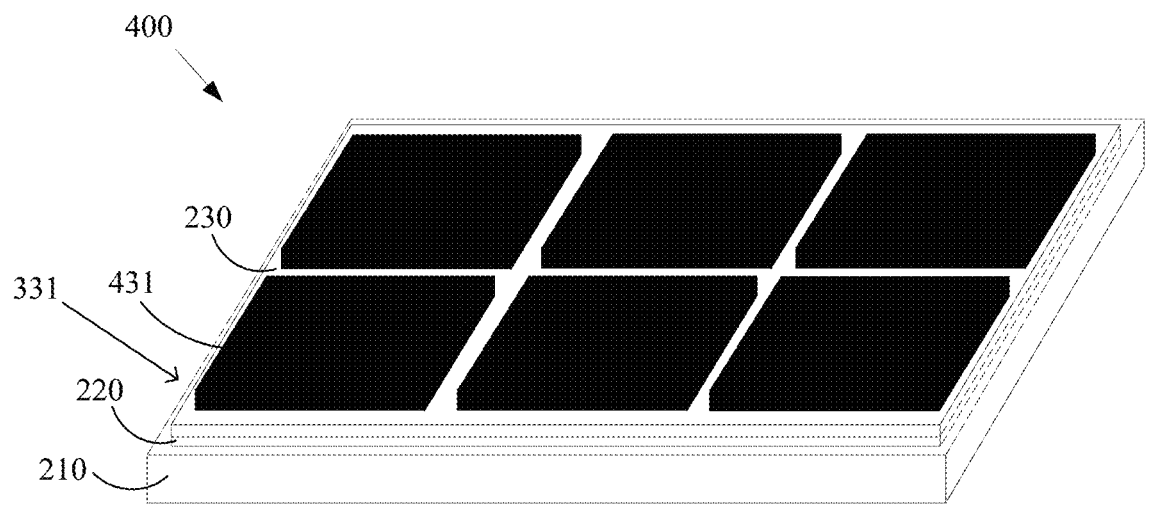
FIGS. 4A-4C show views illustrating example electronic device structures and example methods of making electronic device structures, in accordance with various aspects of the present disclosure, for example as shown in the flow diagram of FIG. 1.
Figure 4B:
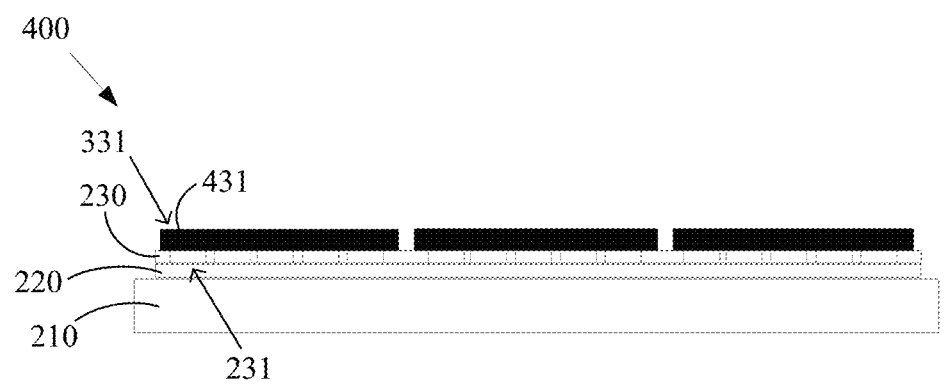

As shown in FIGS. 4A and 4B, the encapsulating material 431 may be separately formed over blocks of dies 331 and substrates 231. In the example shown in FIGS. 3A-3C and 4A-4C, each 5×5 array (or N×N array) of dies 331 and substrates 231 may be encapsulated by a single continuous layer of encapsulating material 431. Alternatively for example, the entire panel of substrates 230 (and electrical components attached thereto) may be encapsulated in a single continuous layer of encapsulating material. Further for example, each substrate 231 of the panel of substrates 230 (and respective electrical component(s) attached thereto) may be encapsulated individually in a respective layer of encapsulating material 431.

Figure 4C:
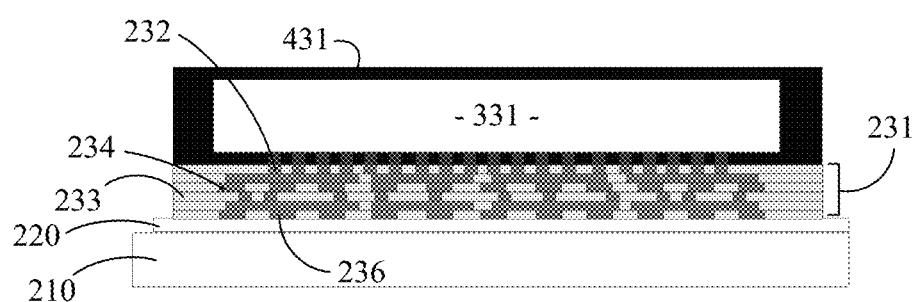
Figure 5A:
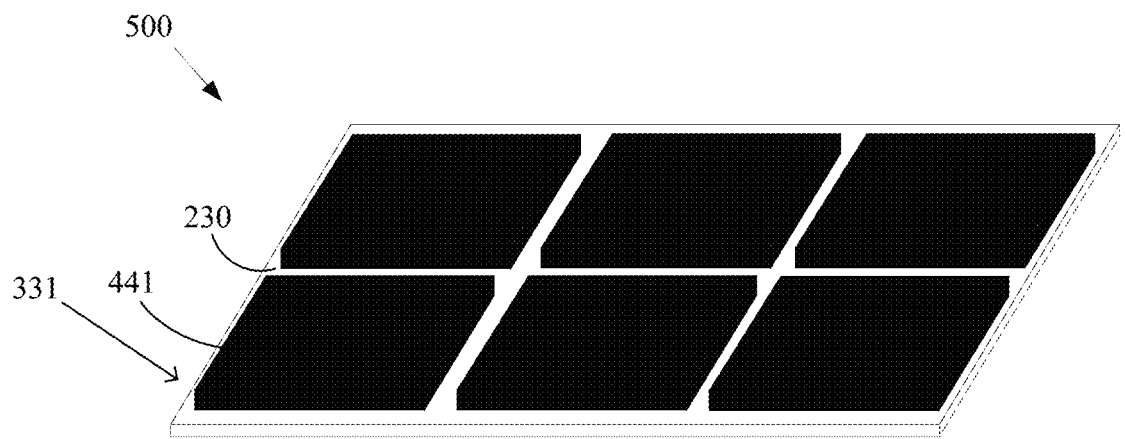
FIGS. 5A-5C show views illustrating example electronic device structures and example methods of making electronic device structures, in accordance with various aspects of the present disclosure, for example as shown in the flow diagram of FIG. 1.
Figure 5B:
Figure 5C:
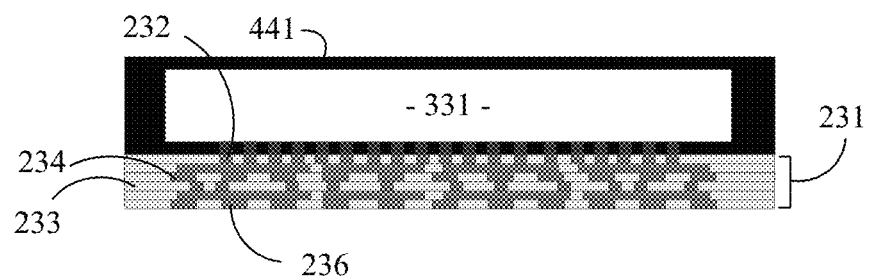
Figure 6A:
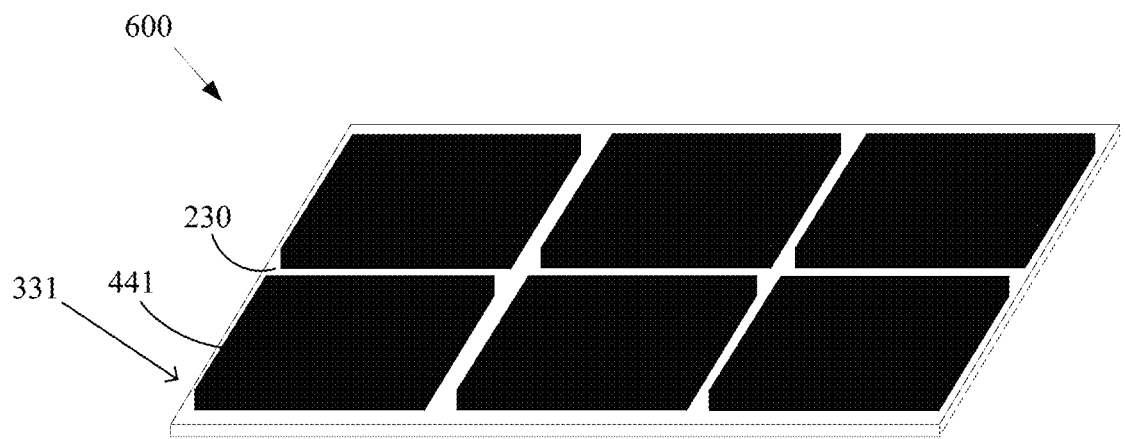
FIGS. 6A-6C show views illustrating example electronic device structures and example methods of making electronic device structures, in accordance with various aspects of the present disclosure, for example as shown in the flow diagram of FIG. 1.
Figure 6B:
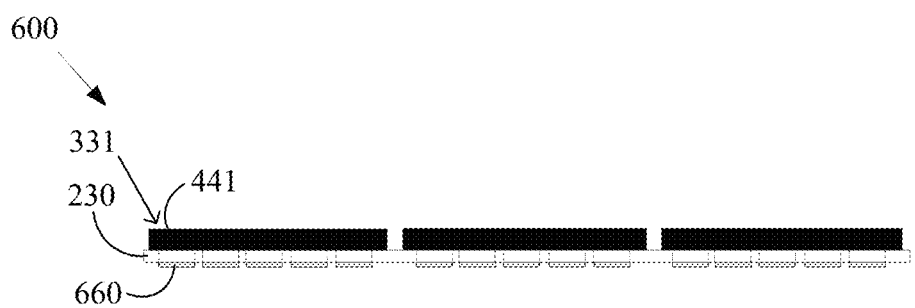
Figure 6C:
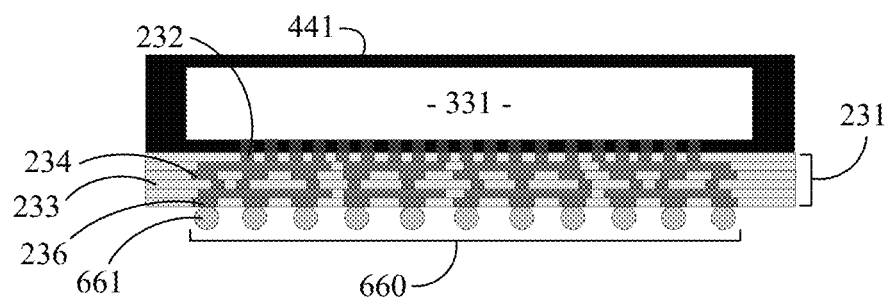
Figure 7A:
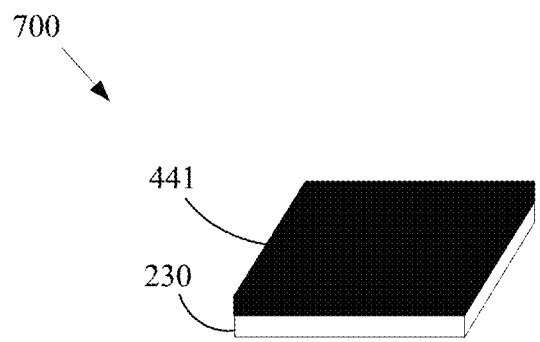
FIGS. 7A-7C show views illustrating example electronic device structures and example methods of making electronic device structures, in accordance with various aspects of the present disclosure, for example as shown in the flow diagram of FIG. 1.
Figure 7B:
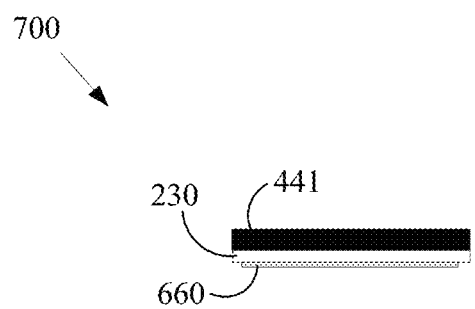
Figure 7C:
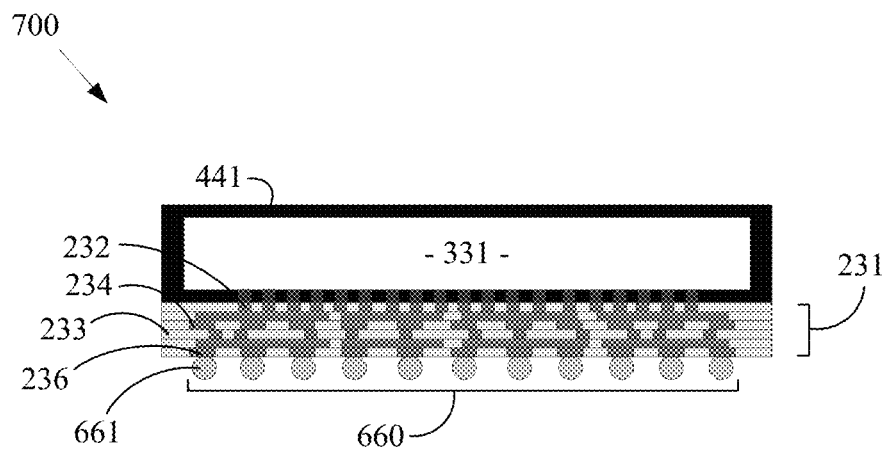

Though, in FIGS. 4A-4C, the semiconductor dies 331 are shown with lateral, bottom, and top sides covered by the encapsulating material 431, this need not be the case. For example, as discussed herein, there may be a separate underfill 335 between a die 331 and the substrate 231 (or SDS). In such an implementation, side surfaces of the underfill 335 may be surrounded by the encapsulating material 431. Also for example, the top sides of the dies 331 may be exposed from the encapsulating material 431. For example, a top surface of the encapsulating material 431 and top surfaces of the dies 331 may be co-planar or substantially co-planar (e.g., within a 1%, 2%, or 5% difference in height, etc.).

In general, block 130 may comprise encapsulating the panel (or strip) (e.g., as received at block 110) with the attached dies (e.g., as attached at block 120) in an encapsulating material. Thus, the scope of this disclosure is not limited by characteristics of any particular encapsulation or encapsulating material, or by characteristics of any particular manner of performing such encapsulating.

The example method 100 may, at block 140, comprise removing the carrier. Block 140 may comprise performing such removing in any of a variety of manners, non-limiting examples of which are provided herein. For example, various example aspects of block 140 are presented in FIGS. 5A-5C. Block 140 and FIGS. 5A-5C will now be discussed together. For example, comparing FIGS. 5A-5C to 4A-4C, the carrier 210 and the adhesive layer 220 have been removed.

For example, in a scenario in which an ultraviolet (UV) releasable adhesive is utilized for the adhesive layer 220, the adhesive layer 220 may be exposed to UV light to release the adhesive layer 220 from the carrier 210 and/or from the panel 230. Upon release of the adhesive layer 220, the carrier 210 and the panel 230 may be separated (e.g., pulled or peeled apart, etc.). For example, in an implementation in which the carrier 210 is a glass plate (or made of another transparent material), block 140 may comprise exposing the adhesive layer 220 to UV light passing through the carrier 210. Remnants of the adhesive layer 220 on the carrier 210 and/or on the panel 230 may be removed by chemical and/or mechanical removal techniques (e.g., utilizing a solvent, generally washing, water-jetting, abrading, scraping, peeling, etc.).

Also for example, in a scenario in which thermally releasable adhesive is utilized for the adhesive layer 220, the adhesive layer 220 may be exposed to heat to release the adhesive layer 220 from the carrier 210 and/or from the panel 230. Upon release of the adhesive layer 220, the carrier 210 and the panel 230 may be separated (e.g., pulled apart, peeled apart, etc.). Remnants of the adhesive layer 220 on the carrier 210 and/or on the panel 230 may be removed by chemical and/or mechanical removal techniques (e.g., utilizing a solvent, generally washing, water-jetting, abrading, scraping, peeling, etc.).

In other scenarios, for example utilizing alternative attachment strategies, the carrier 210 may be removed by releasing a mechanical mechanism, removing a vacuum, removing a magnetic or electrostatic coupling, grinding the carrier, etc.

In an example implementation in which the carrier 210 is removed in a non-destructive manner, the carrier may 210 may be cleaned and/or otherwise prepared for re-use. For example, in a scenario in which the carrier 210 (e.g., with the panel of substrates 230 attached) was received from an outside supplier, the removed carrier 210 may be returned to the outside supplier.

In general, block 140 may comprise removing the carrier. Thus, the scope of this disclosure should not be limited by characteristics of any particular manner of removing the carrier.

The example method 100 may, at block 150, comprise forming conductive interconnection structures. Block 150 may comprise forming the conductive interconnection structures in any of a variety of manners, non-limiting examples of which are provided herein. For example, various example aspects of block 150 are presented in FIGS. 6A-6C. Block 150 and FIGS. 6A-6C will now be discussed together. Comparing FIGS. 6A-6C with FIGS. 5A-5C, the conductive interconnection structures 660 have been added.

As discussed herein, the substrates 231 (or SDSs) of the panel 230 may be received with or without any of a variety of conductive interconnection structures (e.g., pads, lands, traces, under-bump metallization layers, bumps, posts, pillars, etc.) on the bottom side of panel 230, for example which is exposed after the removal of the carrier at block 140. In a scenario in which such conductive interconnection structures, or a portion thereof, have not already been formed, block 150 may comprise forming such structures.

For example, in an example implementation in which the conductive interconnection structures 660 (a single example of which is indicated by label 661) comprise one or more under-bump metallization (UBM) layers, such UBM layers and/or the forming thereof may comprise any of a variety of characteristics. For example, the UBM structure may for example comprise a layer of titanium-tungsten (TiW), which may be referred to as a layer or seed layer. Such layer may, for example, be formed by sputtering. Also for example, the UBM structure may comprise a layer of copper (Cu) on the layer of TiW. Such layer may also, for example, be formed by sputtering. In another example implementation, forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure and/or processes utilized to form the UBM structure are not limited to the examples given. For example, the UBM structure may comprise a multilayered structure of chrome/chrome-copper alloy/copper (Cr/Cr-Cu/Cu), titanium-tungsten alloy/copper (Ti—W/Cu), aluminum/nickel/copper (Al/Ni/Cu), equivalents thereof, etc. The UBM structure may also, for example, comprise aluminum, palladium, gold, silver, alloys thereof, etc.

In an example implementation, the conductive interconnection structures 660 may comprise conductive balls or bumps (e.g., solder balls or bumps, C4 bumps, wafer-type bumps, etc.). For example, in an example implementation including a solder ball or bump, such balls or bumps may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosures is not limited thereto.

Such conductive balls or bumps may be formed in any of a variety of manners. For example, such conductive balls or bumps may be formed by ball-dropping, bumping, metal-plating, pasting and reflowing, etc. For example, such conductive balls or bumps may be formed by dropping conductive balls on UBM structures (or conductive pads), reflowing, and cooling.

In an example implementation in which the conductive interconnection structures 660 comprise conductive posts or pillars, such conductive posts or pillars may comprise any of a variety of characteristics. For example, the conductive pillars may be cylinder-shaped, elliptical cylinder-shaped, rectangular post-shaped, etc. The conductive pillars may, for example, comprise a flat upper end, a concave upper end, or a convex upper end. The conductive pillars may, for example, comprise any of the materials discussed herein with regard to the conductive layers. In an example implementation, the conductive pillars may comprise copper (e.g., pure copper, copper with some impurities, etc.), a copper alloy, etc.). In an example implementation, a solder caps (or domes) may be formed on the conductive pillars. The conductive posts or pillars may be formed in any of a variety of manners (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

In general, block 150 may comprise forming conductive interconnection structures. Accordingly, the scope of the present disclosure is not limited by characteristics of any particular type of conductive interconnection structure or by characteristics of any particular manner of forming a conductive interconnection structure.

The example method 100 may, at block 160, comprise singulating individual electronic devices from the panel (or strip). Block 160 may comprise performing such singulating in any of a variety of manners, non-limiting examples of which are provided herein. For example, various example aspects of block 160 are presented in FIGS. 7A-7C. Block 160 and FIGS. 7A-7C will now be discussed together. Comparing FIGS. 7A-7C to FIGS. 6A-6C, individual electronic device 700 has been singulated (or excised or cut) from the encapsulated panel of such devices formed at blocks 110-150.

Block 160 may, for example, comprise performing such singulating utilizing a saw, a stamp cutter, a laser saw or other directed energy cutting device, a snapping device, a nibbling device, etc. Block 160 may, for example, comprise forming the individual electronic device 700 having lateral sides, comprising lateral sides of the encapsulating material 441 and lateral sides of the substrate 231 (or SDS) that are coplanar.

Note that the singulating may be performed after or during any of the blocks of the method 100. Also note that in an example scenario in which only one substrate for a single package is received at block 110 and processed at blocks 110-150, block 160 may be skipped.

In general, block 160 may comprise singulating individual electronic devices from the panel (or strip). Accordingly, the scope of this disclosure should not be limited by characteristics of any particular manner of singulating.

The example method 100 may, at block 195, comprise performing continued processing. Such continued processing may comprise any of a variety of characteristics, non-limiting examples of which are provided herein. For example, block 195 may comprise returning execution flow of the example method 100 to any block thereof. Also for example, block 195 may comprise directing execution flow of the example method 100 to any other method block (or step) discussed herein (e.g., with regard to the example method 800 of FIG. 8, etc.).

As explained herein (e.g., in the discussion of block 110, etc.), any or all parts of the panel of substrates 230 adhered to the carrier 210 may be received or formed. Additionally, any or all of individual substrates 231 of the panel 230 may be tested after forming and/or prior to receiving. Various additional examples of such aspects will now be presented in the discussion of FIGS. 8-13C.

FIG. 8 shows a flow diagram of an example method 800 of making an electronic device, in accordance with various aspects of the present disclosure. The example method 800 may, for example, share any or all characteristics with any other example method(s) discussed herein (e.g., the example method 100 of FIG. 1, etc.). FIGS. 10A-10C, 11A-11B, 12A-12B, and 13A-13C, show perspective and/or cross-sectional views illustrating an example electronic device (e.g., a semiconductor device or package, etc.) and an example method of making an example electronic device, in accordance with various aspects of the present disclosure. FIGS. 10A-10C, 11A-11B, 12A-12B, and 13A-13C may, for example, illustrate an example electronic device at various blocks (or steps) of the method 800 of FIG. 8. FIG. 8 and FIGS. 10A-10C, 11A-11B, 12A-12B, and 13A-13C will now be discussed together. It should be noted that the order of the example blocks of the method 800 may vary without departing from the scope of this disclosure.

The example method 800 may begin executing at block 805. The method 800 may begin executing in response to any of a variety of causes or conditions, non-limiting examples of which are provided herein. For example, the method 800 may begin executing automatically in response to one or more signals received from one or more upstream and/or downstream manufacturing stations, in response to a signal from a central manufacturing line controller, upon arrival of components and/or manufacturing materials utilized during performance of the method 800, upon receipt of an order for one or more of the manufactured assemblies, etc. Also for example, the method 800 may begin executing in response to an operator command to begin. Additionally for example, the method 800 may begin executing in response to receiving execution flow from any other method block (or step) discussed herein.

The example method 800 may, at block 810, comprise receiving (and/or forming) a panel (or strip) of substrates coupled to a carrier. Block 810 may comprise receiving (and/or forming) the panel (or strip) of substrates in any of a variety of manners, non-limiting examples of which are provided herein. For example, various example aspects of block 810 are presented in FIGS. 9A-9C. Block 810 and FIGS. 9A-9C will now be discussed together.

Block 810 may, for example, share any or all characteristics with block 110 of the example method 100 shown in FIG. 1 and discussed herein. The example structure 200' shown in FIGS. 9A-9C may share any or all characteristics with the example structure 200 shown in FIGS. 2A-2C. For example, the panel 230 (or strip) of substrates 231 (or SDSs) adhered to the first carrier 10 with an adhesive layer 20 of FIGS. 9A-9C may share any or all characteristics with the panel 230 (or strip) of substrates 231 (or SDSs) adhered to the carrier 210 of FIGS. 2A-2C.

Figure 9A:
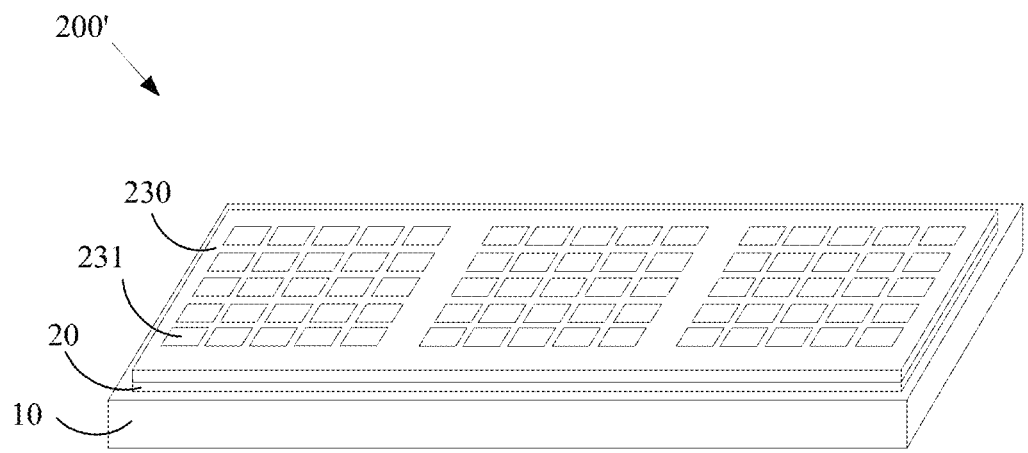
FIGS. 9A-9C show views illustrating example electronic device structures and example methods of making electronic device structures, in accordance with various aspects of the present disclosure, for example as shown in the flow diagram of FIG. 8.
Figure 9B:
Figure 9C:
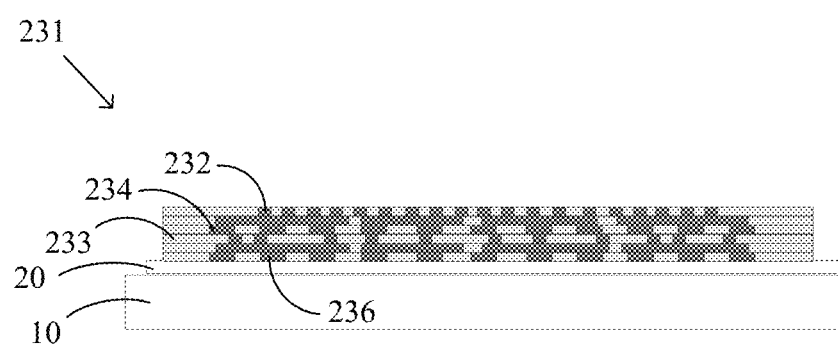

For example, as discussed herein, the panel 230 (or strip) of substrates 231 may be received (or formed) in panel form, strip form, individual substrate form, etc. The example 200' of FIGS. 9A-9C shows a strip 230 of substrates 231 adhered to a strip-sized carrier 10 with a strip-shaped adhesive layer 20.

The example method 800 may, at block 820, comprise forming the Signal Distribution Structure (SDS) (or substrate). Block 820 may, for example, be performed if the panel (or strip) received at block 810 does not comprise the desired SDS or any portion thereof. For example, block 820 may comprise forming the entire SDS, one or more dielectric and/or conductive layers of the SDS, any or all conductive interconnection structures of the SDS, etc.

Block 820 may comprise forming the SDS (or substrate) in any of a variety of manners, non-limiting examples of which are provided herein. For example, various example aspects of block 820 are presented in FIGS. 9A-9C.

Block 820 may, for example, share any or all characteristics with block 110 of the example method 100 shown in FIG. 1 and discussed herein. The example structure 200' shown in FIGS. 9A-9C may share any or all characteristics with the example structure 200 shown in FIGS. 2A-2C.

The example method 800 may, at block 830, comprise attaching a second carrier to the example structure received and/or formed at blocks 810 and 820. Block 830 may comprise attaching (or coupling or mounting) the second carrier in any of a variety of manners, non-limiting examples of which are provided herein. For example, various example aspects of block 830 are presented in FIGS. 10A-10C. Block 830 and FIGS. 10A-10C will now be discussed together.

The example second carrier 1030 is presented having a plurality of apertures 1031 (or windows or openings) that extend through the carrier 1030. Each aperture 1031 corresponds spatially to a respective group of substrates 231 (or SDSs), the tops of which may be accessed through the aperture 1031.

Figure 10A:
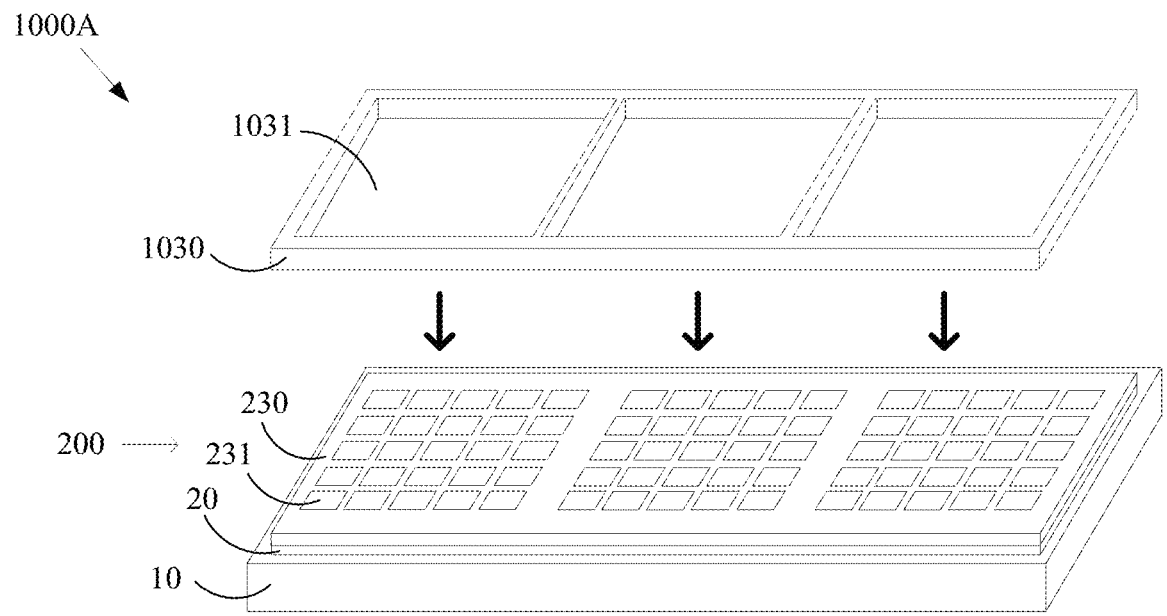
FIGS. 10A-10C show views illustrating example electronic device structures and example methods of making electronic device structures, in accordance with various aspects of the present disclosure, for example as shown in the flow diagram of FIG. 8.
Figure 10B:
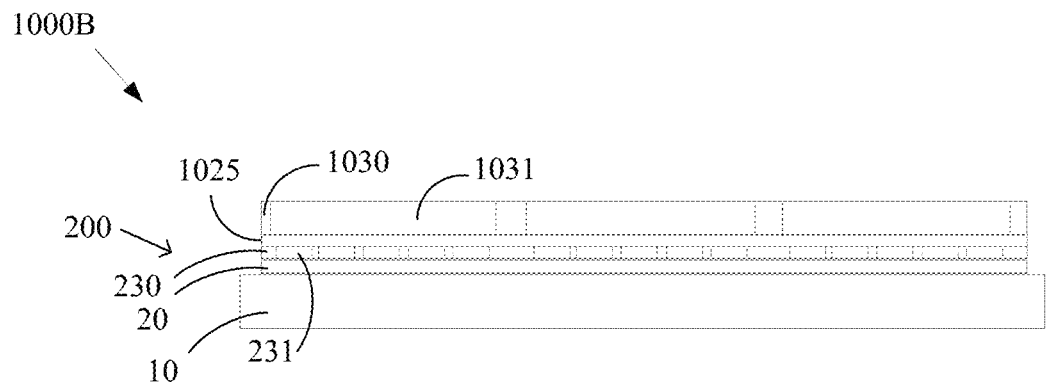
Figure 10C:
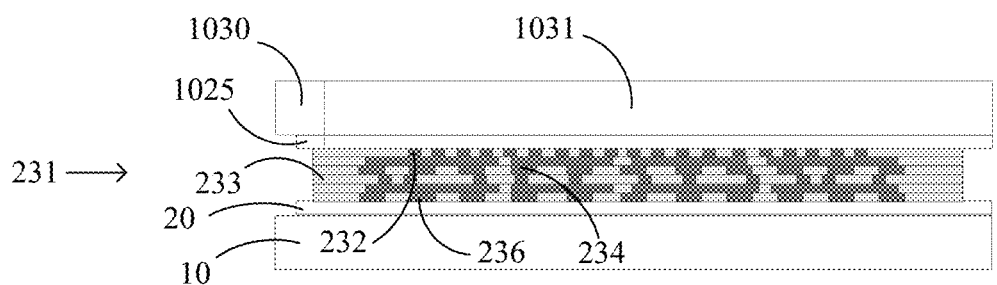
Figure 11A:
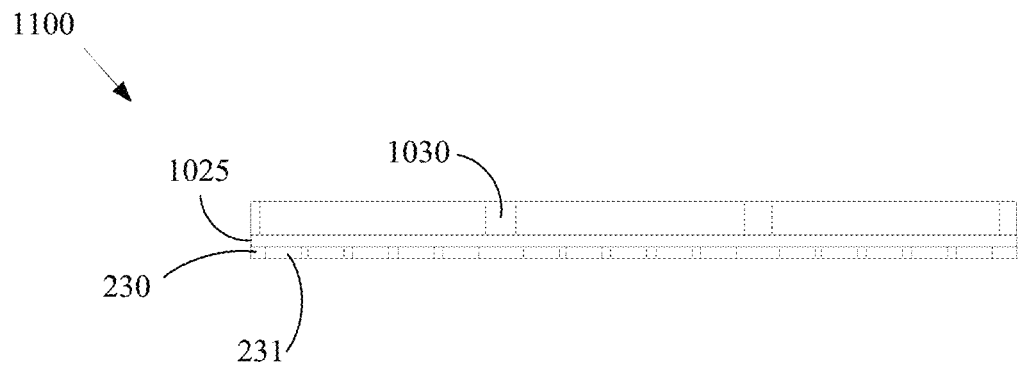
FIGS. 11A-11B show views illustrating example electronic device structures and example methods of making electronic device structures, in accordance with various aspects of the present disclosure, for example as shown in the flow diagram of FIG. 8.
Figure 11B:
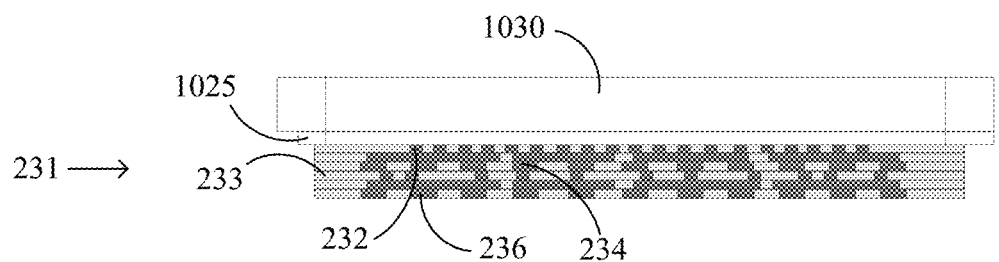

As shown at FIG. 10A, the bottom side of the second carrier 1030 is adhered to the top side of the panel 230 of substrates 231 by a layer of adhesive 1025. The layer of adhesive 1025 may, for example, be shaped like the second carrier 1030 (e.g., including corresponding windows, etc.). Note that the second carrier 1030 may be coupled to the panel 230 in any of a variety of manners (e.g., utilizing a mechanical attachment mechanism, vacuum pressure, electromagnetic force, etc.).

The example second carrier 1030 (and layer of adhesive 1025) is shown having a strip shape and a single row of apertures 1031. However, the scope of this disclosure is not limited thereto. The second carrier 1030 may, for example, have a panel shape, a plurality of rows and/or columns of apertures, etc. Also for example, the second carrier 1030 may comprise a single aperture through which any or all of the substrates 231 of the panel 230 are exposed.

The second carrier 1030 may share any or all material and/or dimensional characteristics with any other carrier discussed herein (e.g., with regard to the carrier 210, the carrier 10, etc.).

Block 830 may, for example, comprise adhering the second carrier 1030 to the top side of the panel 230 (or strip) utilizing a layer 1025 of any of the adhesive materials discussed herein (e.g., a UV releasable adhesive, a thermally releasable adhesive, etc.). In an example implementation, block 830 may comprise adhering the bottom side of the second carrier 1030 (e.g., a metal carrier) to the top side of the panel 230 utilizing a layer of thermally releasable adhesive 1025.

In general, block 830 may comprise attaching a second carrier. Accordingly, the scope of this disclosure should not be limited by characteristics of any particular type of second carrier or by characteristics of any particular manner of attaching such a second carrier.

The example method 800 may, at block 840, comprise removing the first carrier. Block 840 may comprise removing the first carrier in any of a variety of manners, non-limiting examples of which are provided herein. Block 840 may, for example, share any or all characteristics with block 140 of the example method 100 shown in FIG. 1 and discussed herein. For example, various example aspects of block 840 are presented in FIGS. 11A and 11B. Block 840 and FIGS. 11A and 11B will now be discussed together. For example, comparing FIGS. 11A-11B to 10A-10C, the first carrier 10 and the adhesive layer 20 have been removed.

For example, in a scenario in which a layer of ultraviolet (UV) releasable adhesive 20 is utilized to adhesively couple the panel 230 (or strip) to the first carrier 10, the adhesive 20 may be exposed to UV light to release the adhesive from the first carrier 10 and/or from the panel 230. Upon release of the adhesive 20, the first carrier 10 and the panel 230 may be separated (e.g., pulled apart, peeled apart, etc.). For example, in an implementation in which the first carrier 10 is a glass plate (or made of another transparent material), block 840 may comprise exposing the adhesive 20 to UV light passing through the first carrier 10. Remnants of the adhesive layer 20 on the first carrier 10 and/or the panel 230 may be removed by chemical and/or mechanical removal techniques (e.g., utilizing a solvent, generally washing, water-jetting, abrading, scraping, peeling, etc.).

Also for example, in a scenario in which thermally releasable adhesive 20 is utilized to adhesively couple the panel 230 (or strip) to the first carrier 10, the adhesive layer 20 may be exposed to heat to release the adhesive layer 20 from the first carrier 10 and/or from the panel 230. Upon release of the adhesive 20, the first carrier 10 and the panel 230 may be separated (e.g., pulled apart, peeled apart, etc.). Remnants of the adhesive 20 on the first carrier 10 and/or the panel 230 may be removed by chemical and/or mechanical removal techniques (e.g., utilizing a solvent, generally washing, water-jetting, abrading, scraping, peeling, etc.).

In other scenarios, for example utilizing alternative attachment strategies, the first carrier 10 may be removed by releasing a mechanical mechanism, removing a vacuum, removing a magnetic or electrostatic coupling, grinding the carrier, etc.

In an example implementation in which the first carrier 10 is removed in a non-destructive manner, the first carrier may 10 may be cleaned and/or otherwise prepared for re-use. For example, in a scenario in which the first carrier 10 (e.g., with the panel of substrates 230 attached) was received from an outside supplier, the removed first carrier 10 may be returned to the outside supplier.

In general, block 840 may comprise removing the first carrier. Accordingly, the scope of this disclosure should not be limited by characteristics of any particular manner of removing the first carrier.

The example method 800 may, at block 850, comprise performing testing (e.g., electrical testing, mechanical testing, etc.). Block 850 may comprise performing such testing in any of a variety of manners, non-limiting examples of which are provided herein.

For example, block 850 may comprise accessing conductive interconnection structures (e.g., pads, lands, traces, under-bump metallization layers, bumps, posts, pillars, etc.) on a top side of the each of the substrates 231 (or SDSs) through the apertures 1031 of the second carrier 1030, for example with one or more electrical test probes. Also for example, block 850 may comprise accessing conductive interconnection structures (e.g., pads, lands, traces, under-bump metallization layers, bumps, posts, pillars, etc.) on a bottom side of the each of the substrates 231 (or SDSs), for example with one or more electrical test probes. Note that removal of the first carrier 10 may, for example, expose the bottom side of the substrates 231 (or SDSs) for test.

In an example implementation, block 850 may comprise performing an electrical and/or mechanical test on each of the substrates 231 of the panel 230, for example identifying failed substrates 231 as having failed, repairing failed substrates 231 if possible and/or practical, replacing failed substrates 231 if possible and/or practical, etc.

The testing of the substrates 231 may also, for example, include mechanical testing. Such mechanical testing may, for example, comprise visual machine inspection, x-ray inspection, stress testing, etc.

In general, block 850 may comprise performing testing (e.g., electrical testing, mechanical testing, etc.). Accordingly, the scope of this disclosure should not be limited by characteristics of any particular type of test or of any particular manner of testing.

The example method 800 may, at block 860, comprise attaching a third carrier. Block 860 may comprise attaching (or coupling or mounting) the third carrier in any of a variety of manners, non-limiting examples of which are provided herein. For example, various example aspects of block 860 are presented in FIGS. 12A-12B. Block 860 and FIGS. 12A-12B will now be discussed together.

Figure 12A:
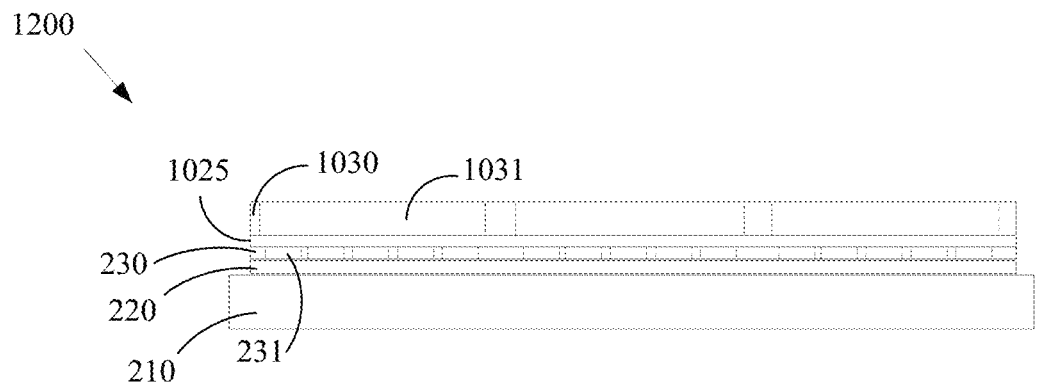
FIGS. 12A-12B show views illustrating example electronic device structures and example methods of making electronic device structures, in accordance with various aspects of the present disclosure, for example as shown in the flow diagram of FIG. 8.
Figure 12B:
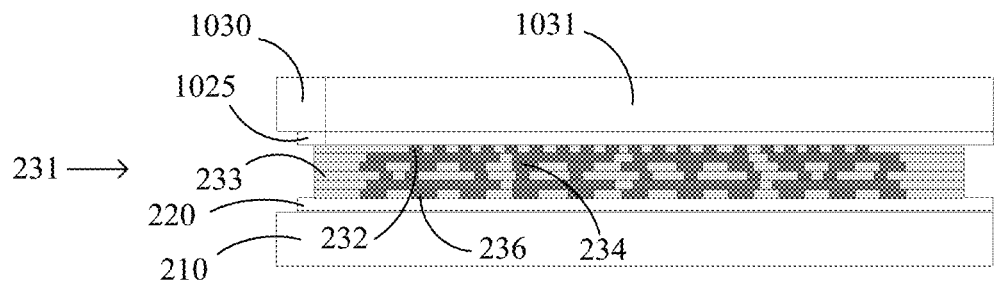
Figure 13A:
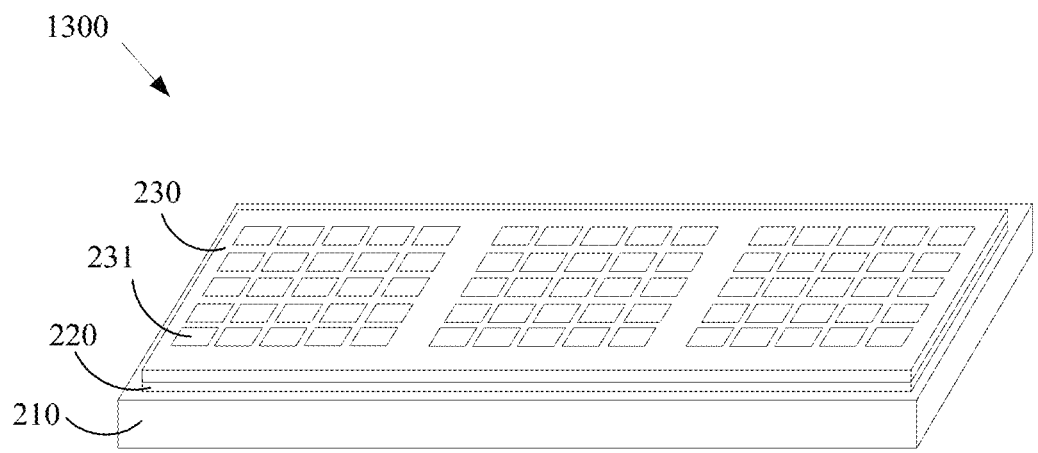
FIGS. 13A-13C show views illustrating example electronic device structures and example methods of making electronic device structures, in accordance with various aspects of the present disclosure, for example as shown in the flow diagram of FIG. 8.
Figure 13B:
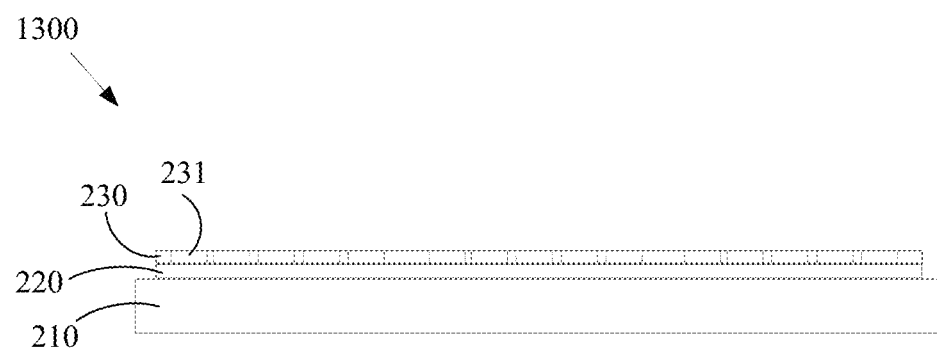
Figure 13C:
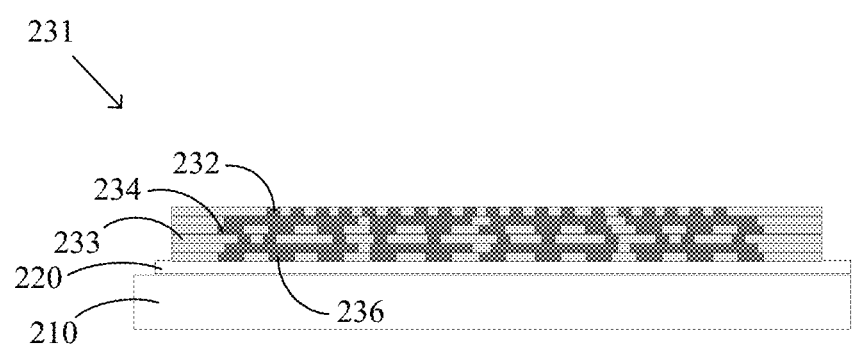

The third carrier 210 of FIGS. 12A and 12B may, for example, share any or all characteristics with the carrier 210 of FIGS. 2A-4C. For example, the third carrier 210 may comprise a panel or strip shape. In an example implementation, the third carrier 210 may comprise a solid strip of glass.

Block 860 may, for example, share any or all carrier attaching (or mounting or coupling) characteristics discussed herein with regard to block 110, block 830, block 810, etc. For example, block 860 may comprise adhering the third carrier 210 to the bottom side of the panel 230 (or strip) utilizing a layer 220 of any of the adhesive materials discussed herein (e.g., a UV releasable adhesive, a thermally releasable adhesive, etc.). In an example implementation, block 860 may comprise adhering the bottom side of the panel 230 to the top side of the third carrier 210 (e.g., a glass carrier) utilizing a layer of UV releasable adhesive 220.

As discussed herein, block 810 may comprise receiving and/or forming the assembly in a panel or strip form. In an example implementation, blocks 810-815 may be performed at the panel level, and then the panel of substrates may be cut into strips (e.g., along saw streets, etc.) prior to the attachment of a plurality of strip-sized third carriers at block 860. For example, after block 860, the assembly may comprise a panel-shaped (or panel-sized) second carrier on a top side of the panel 230 of substrates 231 (which is now cut into strips), and a plurality of strip-shaped (or strip-sized) third carriers on a bottom side of the panel 230 of substrates 231 (which is now cut into strips). In such an implementation, after the panel-shaped second carrier is removed at block 870, the resulting structure may include a plurality of strip-shaped panels of substrates, each attached to a respective third carrier.

In general, block 860 may comprise attaching a third carrier. Accordingly, the scope of this disclosure should not be limited by characteristics of any particular type of third carrier or by characteristics of any particular manner of attaching such a third carrier.

The example method 800 may, at block 870, comprise removing the second carrier. Block 870 may comprise removing the second carrier in any of a variety of manners, non-limiting examples of which are provided herein. Block 870 may, for example, share any or all characteristics with block 140, block 840, etc. For example, various example aspects of block 870 are presented in FIGS. 13A and 13C. Block 870 and FIGS. 13A and 13C will now be discussed together. For example, comparing FIGS. 13A-13C to 12A-12B, the second carrier 1030 and adhesive layer 1025 have been removed.

For example, in a scenario in which an ultraviolet (UV) releasable adhesive 1025 is utilized to adhesively couple the second carrier 1030 to the the panel 230 (or strip), the adhesive 1025 may be exposed to UV light to release the adhesive 1025 from the second carrier 1030 and/or from the panel 230. Upon release of the adhesive 1025, the second carrier 1030 and the panel 230 may be separated (e.g., pulled apart, peeled apart, etc.).

For example, in an implementation in which the second carrier 1030 is a glass plate (or made of another transparent material), block 870 may comprise exposing the adhesive 1025 to UV light passing through the second carrier 1030. Remnants of the adhesive layer 1025 on the second carrier 1030 and/or on the panel 230 may be removed by chemical and/or mechanical removal techniques (e.g., utilizing a solvent, generally washing, water-jetting, abrading, scraping, peeling, etc.).

Also for example, in a scenario in which thermally releasable adhesive 1025 is utilized to adhesively couple the second carrier 1030 to the panel 230 (or strip), the adhesive layer 1025 may be exposed to heat to release the adhesive layer 1025 from the second carrier 1030 and/or from the panel 230. Upon release of the adhesive 1025, the second carrier 1030 and the panel 230 may be separated (e.g., pulled apart, peeled apart, etc.). Remnants of the adhesive 1025 on the second carrier 1030 and/or on the panel 230 may be removed by chemical and/or mechanical removal techniques (e.g., utilizing a solvent, generally washing, water-jetting, abrading, scraping, peeling, etc.).

In other scenarios, for example utilizing alternative attachment strategies, the second carrier 1030 may be removed by releasing a mechanical mechanism, removing a vacuum, removing a magnetic or electrostatic coupling, grinding the carrier, etc.

In an example implementation in which the second carrier 1030 is removed in a non-destructive manner, the second carrier may 1030 may be cleaned and/or otherwise prepared for re-use. For example, in a scenario in which the second carrier 1030 (e.g., with the panel of substrates 230 attached) was received from an outside supplier, the removed second carrier 1030 may be returned to the outside supplier.

Note that in various example implementations of the example method 800, block 870 may be skipped, with the final result of the method 800 being the structure with the second carrier at the top side of the panel (or strip) of substrates, and one or more third carriers at the bottom side of the panel (or strip) of substrates. For example, block 895 may comprise shipping or otherwise providing such a structure to a next process. The second carrier may then, for example, be removed later (e.g., before, after, or during any of the blocks of the example method 100).

In general, block 870 may comprise removing the second carrier. Accordingly, the scope of this disclosure should not be limited by characteristics of any particular manner of removing the second carrier.

The example method 800 may, at block 895, comprise performing continued processing.

Such continued processing may comprise any of a variety of characteristics, non-limiting examples of which are provided herein. For example, block 895 may comprise returning execution flow of the example method 800 to any block thereof. Also for example, block 895 may comprise directing execution flow of the example method 800 to any other method block (or step) discussed herein (e.g., with regard to the example method 100 of FIG. 1, etc.). For example, the structure (e.g., panel or strip structure) formed by the method 800, for example the panel 230 of substrates 231 (or SDSs) adhered to the carrier 210, may be provided as an input to block 110 of the method 100 of FIG. 1.

The discussion herein included numerous illustrative figures that showed various portions of semiconductor device assemblies or structures (or packages) and/or methods of manufacturing thereof. For illustrative clarity, such figures did not show all aspects of each example assemblies or structures. Any of the example assemblies presented herein may share any or all characteristics with any or all other assemblies or structures presented herein.

In summary, various aspects of this disclosure provide a semiconductor device and a method of manufacturing a semiconductor device. For example, various aspects of this disclosure provide a semiconductor device having an ultra-thin substrate, and a method of manufacturing a semiconductor device having an ultra-thin substrate. As a non-limiting example, a substrate structure comprising a carrier, an adhesive layer formed on the carrier, and an ultra-thin substrate formed on the adhesive layer may be received and/or formed, components may then be mounted to the ultra-thin substrate and encapsulated, and the carrier and adhesive layer may then be removed. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing, the method comprising:
receiving a substrate structure comprising:
- a carrier comprising a carrier top side and a carrier bottom side;
- an adhesive layer comprising an adhesive layer top side and an adhesive layer bottom side, wherein the adhesive layer bottom side is coupled to the carrier top side; and
- a panel comprising a plurality of strips, a panel top side, and a panel bottom side, wherein the panel bottom side is coupled to the adhesive layer top side, wherein each strip comprises a matrix of signal distribution structures, and wherein separation between signal distribution structures of adjacent strips of the panel is greater than separation between adjacent signal distribution structures of a strip;

coupling semiconductor dies to a first strip of the plurality of strips such that each semiconductor die is coupled to a respective signal distribution structure of the first strip; and encapsulating a die lateral side of each semiconductor die in encapsulating material.

2. The method of claim 1, wherein the adhesive layer bottom side directly contacts the carrier top side.

3. The method of claim 1, wherein the adhesive layer laterally spans the plurality of strips.

4. The method of claim 1, comprising removing the carrier from the panel.

5. The method of claim 1, comprising:
exposing the adhesive layer to light that releases the adhesive layer; and
removing the carrier from the panel after exposing the adhesive layer to light.

6. The method of claim 1, comprising separating strips of the panel from one another.

7. The method of claim 1, comprising cutting through the panel to separate the plurality of strips.

8. A method of manufacturing, the method comprising:
receiving a substrate structure comprising:

a carrier comprising a carrier top side and a carrier bottom side;

a panel comprising a signal distribution layer that provides a plurality of signal distribution structures arranged in a matrix of sub-panels, wherein each sub-panel comprises a matrix of signal distribution structures, and wherein separation between signal distribution structures of adjacent sub-panels is greater than separation between adjacent signal distribution structures of a sub-panel;

an adhesive layer that adheres a bottom side of the signal distribution layer to the carrier top side; and coupling semiconductor dies to a first sub-panel from the matrix of sub-panels such that each semiconductor die is coupled to a respective signal distribution structure of the first sub-panel; and encapsulating a die lateral side of each semiconductor die in encapsulating material.

9. The method of claim 8, wherein the adhesive layer directly contacts the bottom side of the signal distribution layer and directly contacts the carrier top side.

10. The method of claim 8, wherein the adhesive layer laterally spans the bottom side of the signal distribution layer.

11. The method of claim 8, comprising removing the carrier from the signal distribution layer.

12. The method of claim 8, comprising:

exposing the adhesive layer to light that releases the adhesive layer; and removing the carrier from the signal distribution layer after exposing the adhesive layer to light.

13. The method of claim 8, comprising separating the matrix of sub-panels into a plurality of separate sub-panels.

14. The method of claim 13, wherein each separate sub-panel comprises a strip of signal distribution structures.

15. The method of claim 8, comprising cutting through the signal distribution layer to separate the sub-panels from one another.

16. A method of manufacturing, the method comprising:

forming a panel on a carrier, wherein the panel comprises a plurality of dielectric layers and a plurality of conductive layers, wherein the plurality of dielectric layers and the plurality of conductive layers define a matrix of sub-panels, wherein each sub-panel comprises a matrix of signal distribution structures, and wherein separation between signal distribution structures of adjacent sub-panels is greater than separation between adjacent signal distribution structures of a sub-panel;

coupling semiconductor dies to the sub-panels such that each semiconductor die is coupled to a respective signal distribution structure; and encapsulating a die lateral side of each semiconductor die in encapsulating material.

17. The method of claim 16, comprising removing the carrier from the panel.

18. The method of claim 16, comprising:

exposing an adhesive layer between the panel and the carrier to light that releases the adhesive layer; and removing the carrier from the panel after exposing the adhesive layer to light.

19. The method of claim 16, comprising separating the panel into a plurality of the sub-panels.

20. The method of claim 16, wherein separating comprises cutting through the plurality of dielectric layers.

* * * * *